United States Patent
Chi et al.

(10) Patent No.: US 11,211,480 B2
(45) Date of Patent: Dec. 28, 2021

(54) HETEROJUNCTION BIPOLAR TRANSISTOR

(71) Applicant: Advanced Wireless Semiconductor Company, Tainan (TW)

(72) Inventors: You-Min Chi, Tainan (TW); Kuo-Chun Huang, Tainan (TW); Kun-Mu Hsieh, Tainan (TW); Yu-Chen Chiu, Tainan (TW)

(73) Assignee: ADVANCED WIRELESS SEMICONDUCTOR COMPANY, Tainan (TW)

( * ) Notice: Subject to any disclaimer, the term of this patent is extended or adjusted under 35 U.S.C. 154(b) by 0 days.

(21) Appl. No.: 16/557,079

(22) Filed: Aug. 30, 2019

(65) Prior Publication Data
US 2020/0227540 A1 Jul. 16, 2020

(30) Foreign Application Priority Data
Jan. 11, 2019 (TW) .................... 108200531

(51) Int. Cl.
| | |
|---|---|
| H01L 29/66 | (2006.01) |
| H01L 29/737 | (2006.01) |
| H01L 29/08 | (2006.01) |
| H01L 29/10 | (2006.01) |
| H01L 29/423 | (2006.01) |
| H01L 29/205 | (2006.01) |
| H01L 29/40 | (2006.01) |
| H01L 29/417 | (2006.01) |
| H01L 21/027 | (2006.01) |

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/205* (2013.01); *H01L 29/401* (2013.01); *H01L 29/41708* (2013.01); *H01L 29/42304* (2013.01); *H01L 29/66318* (2013.01); *H01L 21/0274* (2013.01)

(58) Field of Classification Search
None
See application file for complete search history.

(56) References Cited

U.S. PATENT DOCUMENTS

| | | | | |
|---|---|---|---|---|
| 5,633,179 | A | * | 5/1997 | Kamins ............. H01L 29/66242 257/E21.371 |
| 5,846,867 | A | * | 12/1998 | Gomi ................ H01L 29/66242 438/318 |
| 2003/0160301 | A1 | * | 8/2003 | Furukawa ........... H01L 27/0652 257/539 |
| 2019/0305094 | A1 | * | 10/2019 | Tao ........................ H01L 29/205 |
| 2020/0259004 | A1 | * | 8/2020 | Tao ...................... H01L 29/7371 |

* cited by examiner

*Primary Examiner* — Benjamin P Sandvik
(74) *Attorney, Agent, or Firm* — Muncy, Geissler, Olds & Lowe, P.C.

(57) ABSTRACT

A heterojunction bipolar transistor includes a substrate, a semiconductor unit, an electrode unit and a dielectric layer. The semiconductor unit includes a collector layer, a base layer and an emitter layer sequentially formed on the substrate in such order. The electrode unit includes a collector electrode, a base electrode, and an emitter electrode respectively disposed on the collector layer, the base layer and the emitter layer. The dielectric layer covers and cooperates with the emitter layer to define an opening extending therethrough and terminating at the base layer to expose a contact region. The base electrode is disposed on the contact region, extends through the opening, and partially covers the dielectric layer.

4 Claims, 5 Drawing Sheets

HETEROJUNCTION BIPOLAR TRANSISTOR

CROSS-REFERENCE TO RELATED APPLICATION

This application claims priority of Taiwanese Utility Model Patent Application No. 108200531, filed on Jan. 11, 2019.

FIELD

The present disclosure relates to a transistor, and more particularly to a heterojunction bipolar transistor.

BACKGROUND

In order to meet the requirements for a high-speed wireless communication system, active electronic components, such as transistors, triode vacuum tubes, tunnel diodes, etc., should have a high frequency and a high power output. Power amplifiers, such as heterojunction bipolar transistors (HBT) and high speed electron mobility transistors (HEMT), which are made of group III-V semiconductor materials such as gallium nitride (GaN) and gallium arsenide (GaAs), are conferred with advantageous characteristics such as high power, good linearity, high cutoff frequency, low power loss, etc. Therefore, the aforementioned power amplifiers can meet the fifth generation (5G) ultra high frequency cellular communication network requirements.

Referring to FIG. 1, a conventional HBT 1 includes a substrate 11, a semiconductor unit 12 and an electrode unit 13. The semiconductor unit 12 includes a collector layer 121, a base layer 122 and an emitter layer 123 that are sequentially formed on the substrate 11 in such order. The electrode unit 13 includes a collector electrode 131, a base electrode 132 and an emitter electrode 133 that are respectively disposed on the collector layer 121, the base layer 122 and the emitter layer 123. The conventional HBT 1 has an output frequency that may be calculated according to the following formula (I):

$$f_{max} = \sqrt{\frac{f_T}{8\pi R_b C_{bc}}} \quad (I)$$

wherein $f_{max}$ represents maximum oscillation frequency where unilateral power gain (U) becomes unity (i.e., zero decibel (dB)), $f_T$ represents cutoff frequency where current gain goes to unity (i.e., zero dB), $R_b$ represents resistance of the base electrode 132, and $C_{bc}$ represents junction capacitance of the collector layer 121 and the base layer 122.

As noted from formula (I), the $f_{max}$ of the conventional HBT 1 may be increased by reducing the $R_b$ and/or reducing the $C_{bc}$.

The $R_b$ is usually reduced by increasing a width (critical dimension (CD)) of the base electrode 132 (i.e., increasing a contacting area of the base electrode 132 and the base layer 122), or increasing a height (H) of the base electrode 132. Even though increasing the CD of the base electrode 132 may reduce the $R_b$, the $C_{bc}$ may be increased as well, which might negatively affect the $f_{max}$ of the conventional HBT 1. Therefore, it is preferred to fix the CD and increase the height (H) of the base electrode 132 so as to increase the $f_{max}$ of the conventional HBT 1.

Referring to FIG. 2, in combination with FIG. 1, the base electrode 132 is formed by first applying a photoresist layer (PR) on the base layer 122 to define an open area having the width (CD) through a photolithography process, and then depositing a metal material for forming the base electrode 132 in the open area. However, undercuts might be generated on the photoresist layer when a developer is applied thereto during the photolithography process. These undercuts are undesirable and might become more serious with increasing thickness of the photoresist layer, and when the $R_b$ of the base electrode 132 needs to be reduced by increasing the height (H) thereof, deposition of the metal material might generate metal foot 130 along the undercuts of the photoresist layer. If the thus formed base electrode 132 has an increased height, the metal foot 130 would become more serious. The metal foot 130 not only increases the CD of the thus formed base electrode 132 that is in contact with the base layer 122, which in turn negatively affects the $f_{max}$, but also might cause electrical short circuit when a protruding portion of the metal foot 130 contacts the emitter layer 123, particularly in miniaturized version of the conventional HBT 1.

SUMMARY

Therefore, an object of the present disclosure is to provide a heterojunction bipolar transistor that can alleviate at least one of the drawbacks of the prior art.

According to the present disclosure, the heterojunction bipolar transistor includes a substrate, a semiconductor unit, an electrode unit and a dielectric layer. The semiconductor unit includes a collector layer that is disposed on the substrate, a base layer that is disposed on the collector layer, and an emitter layer that is disposed on the base layer. The electrode unit includes a collector electrode, a base electrode, and an emitter electrode that are respectively disposed on the collector layer, the base layer and the emitter layer. The dielectric layer covers the emitter layer. The dielectric layer and the emitter layer cooperatively define an opening extending therethrough and terminating at the base layer to expose a contact region of the base layer. The base electrode is disposed on the contact region of the base layer, extends through the opening, and partially covers the dielectric layer.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
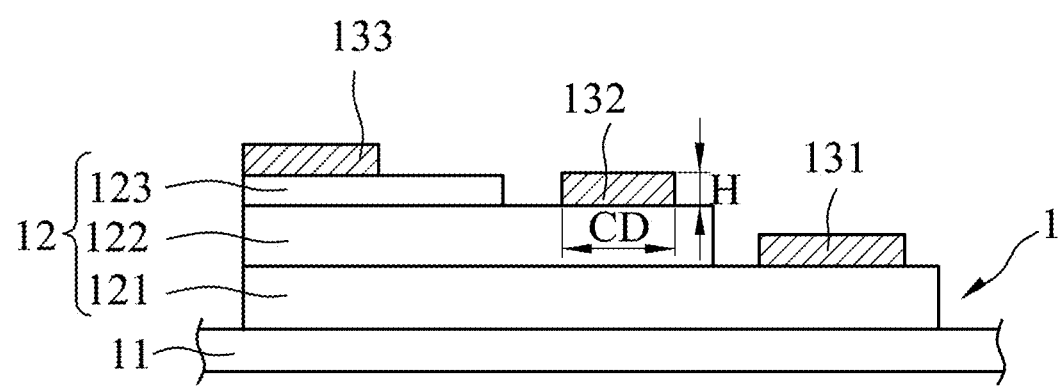
FIG. 1 is a fragmentary schematic view illustrating a conventional heterojunction bipolar transistor.
Figure 2:
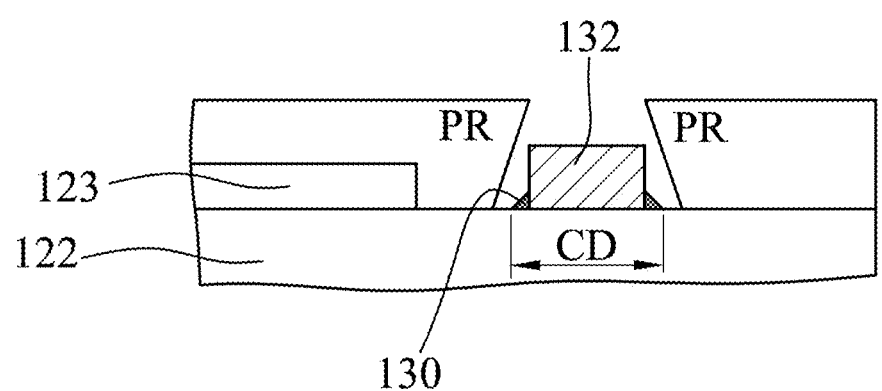
FIG. 2 is a fragmentary schematic view illustrating formation of a base electrode of the conventional heterojunction bipolar transistor.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 3:
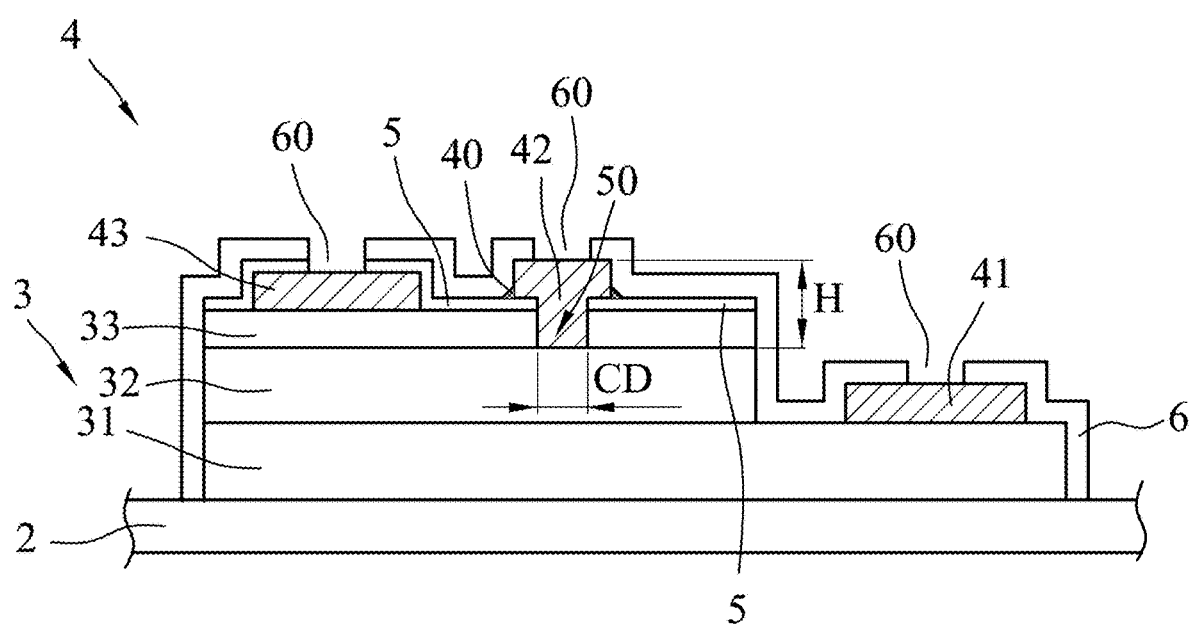
FIG. 3 is a fragmentary schematic view illustrating an embodiment of a heterojunction bipolar transistor according to the present disclosure.
Figure 5:
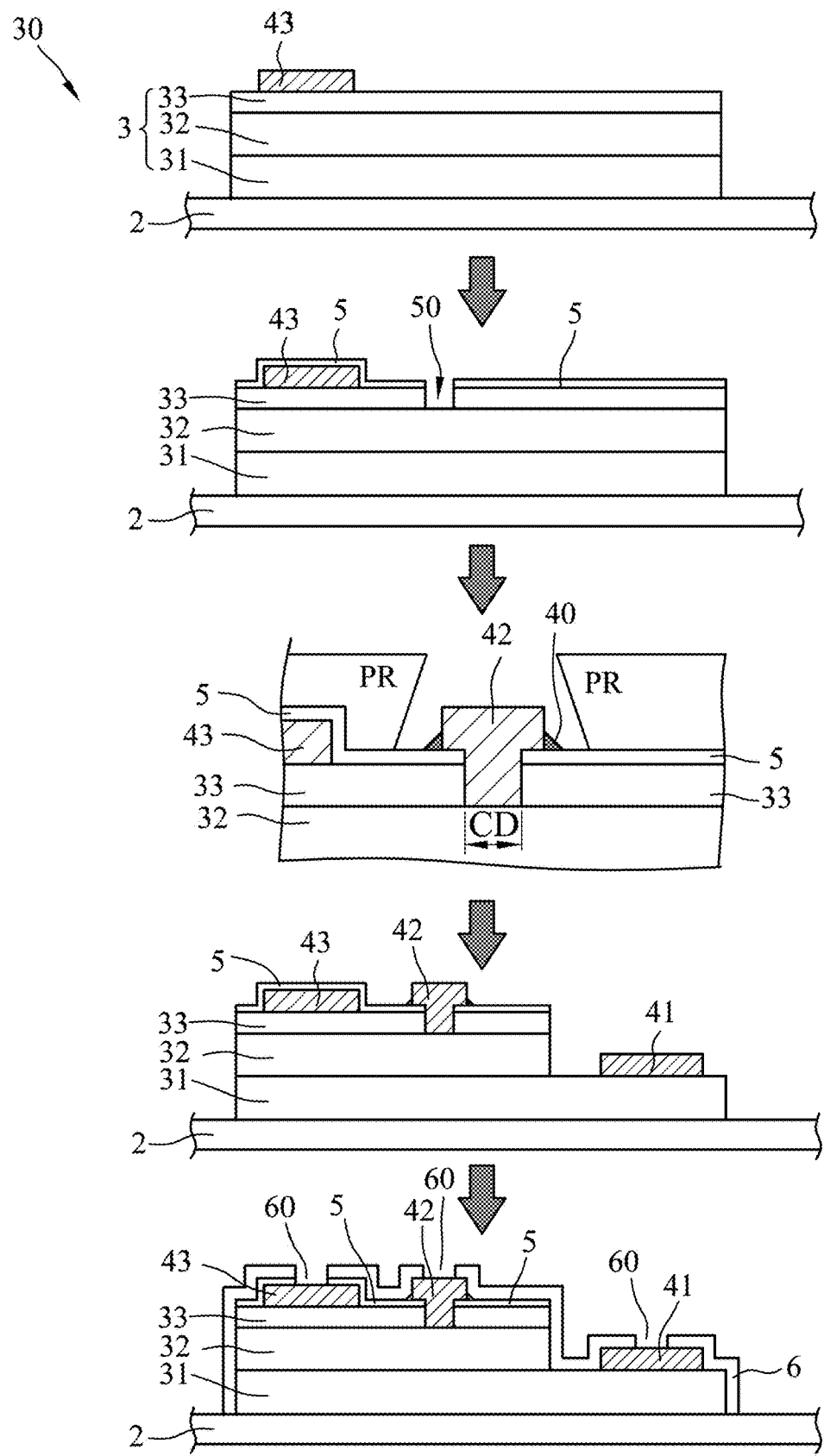
FIG. 5 illustrates the consecutive steps of the method for preparing the embodiment of the heterojunction bipolar transistor.

Referring to FIGS. 3 and 5, an embodiment of a heterojunction bipolar transistor according to the present disclosure includes a substrate 2, a semiconductor unit 3, an electrode unit 4, a dielectric layer 5 and an isolation layer 6.

The substrate 2 is made of a semi-insulating semiconductor material.

The semiconductor unit 3 includes a collector layer 31 that is disposed on the substrate 2, a base layer 32 that is disposed on the collector layer 31, and an emitter layer 33 that is disposed on the base layer 32.

Each of the collector layer 31, the base layer 32 and the emitter layer 33 is made of a group III-V semiconductor material. Examples of the group III-V semiconductor material may include, but are not limited to, gallium nitride (GaN), gallium arsenide (GaAs), indium gallium arsenide (InGaAs), indium phosphide (InP), and indium gallium phosphide (InGaP). The collector layer 31, the base layer 32 and the emitter layer 33 may be independently formed as a single layer structure or multi-layered structure. Since the material and structure of the collector layer 31, the base layer 32 and the emitter layer 33 are well known to those skilled in the art, further details thereof are not provided herein for the sake of brevity.

The electrode unit 4 includes a collector electrode 41 that is disposed on the collector layer 31 and that is spaced apart from the base layer 32, a base electrode 42 that is disposed on the base layer 32, and an emitter electrode 43 that is disposed on the emitter layer 33. Each of the collector electrode 41, the base electrode 42 and the emitter electrode 43 is made of an electrically conductive material, and may be formed as a single layer structure or multi-layered structure. Examples of the electrically conductive material may include a metal or a metal alloy having an excellent conductivity. As shown in FIG. 3, each of the collector electrode 41, the base electrode 42 and the emitter electrode 43 of this embodiment is formed as a single layer structure, but is not limited thereto in actual practice. In certain embodiments, the base electrode 42 has a height (H) that is not less than 2000 Å.

The dielectric layer 5 covers the emitter layer 33 and may optionally cover a portion of the emitter electrode 43. The dielectric layer 5 and the emitter layer 33 cooperatively define an opening 50 extending therethrough and terminating at the base layer 32 to expose a contact region of the base layer 32. Therefore, the opening 50 and the contact region of the base layer 32 have the same width (shown as CD in FIG. 3). The base electrode 42 is disposed on the contact region of the base layer 32, extends through the opening 50, and partially covers the dielectric layer 5. In certain embodiments, the width (CD) is not more than 0.8 μm.

Since the dielectric layer 5 and the emitter layer 33 cooperatively defines the opening 50 that allows the base layer 32 and the base electrode 42 to directly contact each other, the dielectric layer 5 may be made of any suitable insulating material, such as nitrides, oxides, oxynitrides, and combinations thereof. Examples of the insulating material may include, but are not limited to, silicon oxides ($SiO_x$), silicon nitrides ($SiN_x$), and silicon oxynitrides ($SiN_xO_y$). In this embodiment, the dielectric layer 5 is made of $Si_3N_4$.

The isolation layer 6 covers the semiconductor unit 3, the electrode unit 4 and the dielectric layer 5, and has through holes 60 to respectively expose the collector electrode 41, the base electrode 42 and the emitter electrode 43. Examples of an insulating material suitable for making the isolation layer 6 may include, but are not limited to, silicon nitrides, silicon oxides, and polyimides.

Figure 4:
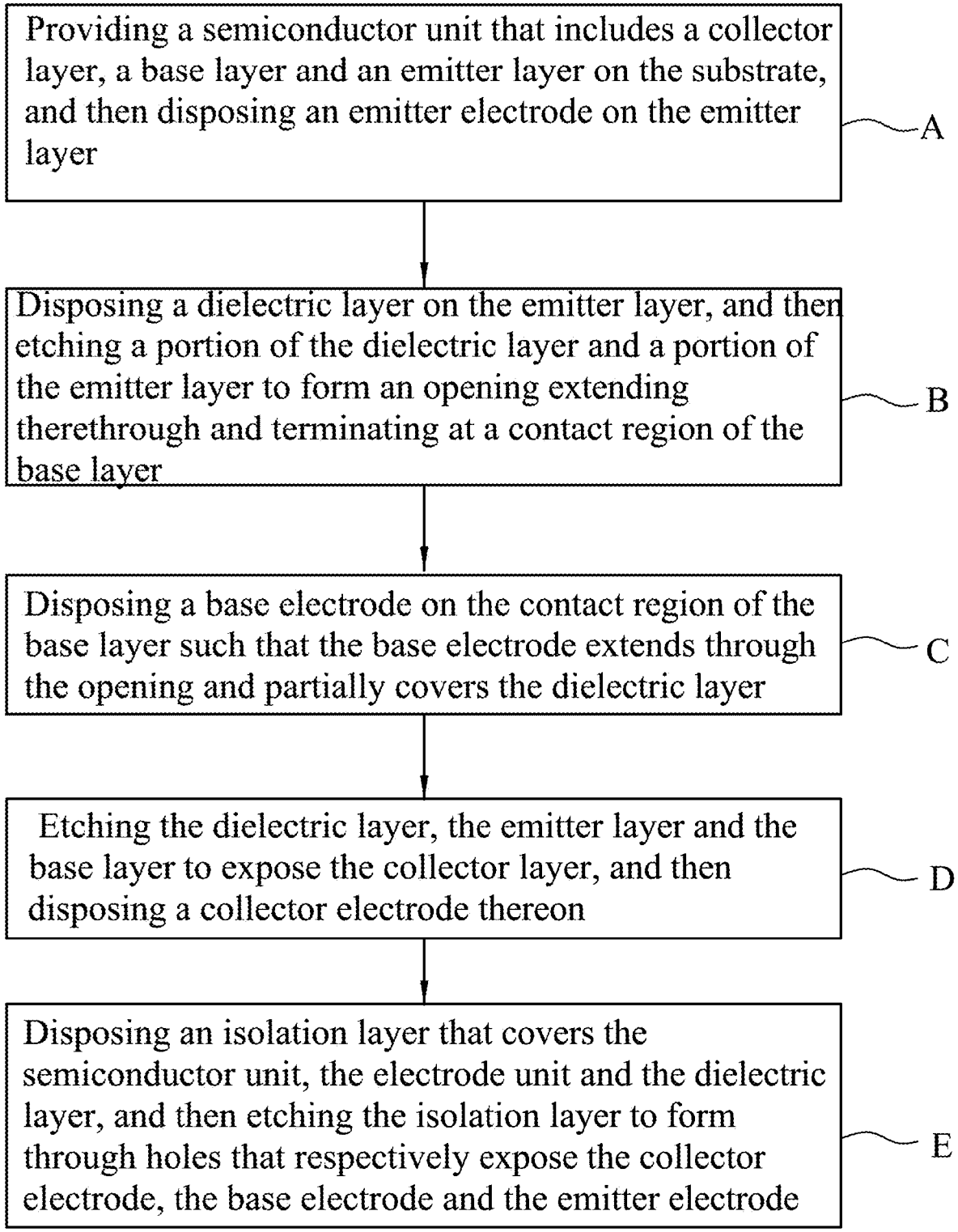
FIG. 4 is a flow chart illustrating consecutive steps of a method for preparing the embodiment of the heterojunction bipolar transistor.

Referring to FIGS. 4 and 5, a method for manufacturing the embodiment of the heterojunction bipolar transistor includes the following steps A to E.

In step A, a semi-finished semiconductor product 30 having the semiconductor unit 3 formed on the substrate 2 is provided. The semiconductor unit 3 includes the collector layer 31, the base layer 32 and the emitter layer 33, which are sequentially disposed on the substrate 2 in such order by an epitaxial growth mode. Examples of the epitaxial growth mode may include, but are not limited to, metal-organic chemical vapor deposition (MOCVD), molecular-beam epitaxy (MBE), liquid-phase epitaxy (LPE), etc. Since primary materials and process parameters required in the epitaxial growth mode are well-known to those skilled in the art, further details thereof are not provided herein for the sake of brevity. An electrically conductive material is then deposited on a portion of the emitter layer 33 using a photolithography process, so as to obtain the emitter electrode 43 disposed thereon.

In step B, the dielectric layer 5 is disposed on and covers the emitter layer 33. The dielectric layer 5 may also cover a portion of the emitter electrode 43. After that, a portion of the dielectric layer 5 and a portion of the emitter layer 33 are etched downwardly using a photolithography process, such that the opening 50 having the width (CD) is formed to extend through the dielectric layer 5 and the emitter layer 33 and to terminate at the base layer 32, and a contact region of the base layer 32 is exposed.

In step C, the base electrode 42 is disposed on the contact region of the base layer 32 and extends through the opening 50. Specifically, a photoresist layer (PR) is first applied on an area of the dielectric layer 5 corresponding to the opening 50, so as to define an opening region for forming the base electrode 42 with a predetermined height (H) and width (CD). Afterwards, an electrically conductive material is deposited on the contact region of the base layer 32 through the opening region defined by the photoresist layer, thereby obtaining the base electrode 42 having the predetermined height and width (CD), extending through the opening 50, and partially covering the dielectric layer 5. Subsequently, the photoresist layer is removed from the dielectric layer 5. It should be noted that, although metal foot 40 might still be generated during the formation of the base electrode 42, the presence of the dielectric layer 5 prevents the metal foot 40 from directly contacting the base layer 32 and the emitter layer 33, such that a contacting area between the base layer 32 and the base electrode 42 can be accurately controlled.

In step D, the collector electrode 41 is disposed on the collector layer 31, and is spaced apart from the base layer 32. Specifically, a portion of the dielectric layer 5, a portion of the emitter layer 33, and a portion of the base layer 32 were etched downwardly in such order to expose a portion of the collector layer 31. Then, an electrically conductive material is deposited on the exposed portion of the collector layer 31, so as to obtain the collector electrode 41.

In step E, the isolation layer 6 is disposed on and covers the semiconductor unit 3, the electrode unit 4 and the dielectric layer 5, and is formed with the through holes 60. Specifically, an insulating material is deposited on the semiconductor unit 3, the collector electrode 41, the base electrode 42, the emitter electrode 43 and the dielectric layer 5 to obtain the isolating layer 6. The isolation layer 6 is then etched downwardly using a photolithography process to form the through holes 60 that respectively expose the collector electrode 41, the base electrode 42 and the emitter electrode 43 for connecting to an external electrical source, thereby completing the manufacturing of the heterojunction bipolar transistor as shown in FIG. 3.

In summary, by virtue of the dielectric layer 5 disposed on the emitter layer 33, and the opening 50 cooperatively defined by the dielectric layer 5 and the emitter layer 33, the base electrode 42 can be accurately disposed on the contact region of base layer 32 and thus have a predetermined width (CD). In addition, due to the insulating effect provided by the dielectric layer 5, the metal foot 40 possibly generated with increasing the height (H) of the base electrode 42 does not come into contact with the base layer 32 and the emitter layer 33, thereby preventing the contacting area between of the base layer 32 and the base electrode 42 from being undesirably increased. As such, the resistance ($R_b$) of the base electrode 42, and the junction capacitance ($C_{bc}$) of the collector layer 31 and the base layer 32 can be simultaneously reduced, which in turn effectively increases the maximum oscillation frequency ($f_{max}$) of the heterojunction bipolar transistor of the present disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A heterojunction bipolar transistor, comprising:
    a substrate;
    a semiconductor unit including a collector layer that is disposed on said substrate, a base layer that is disposed on said collector layer, and an emitter layer that is disposed on said base layer, said semiconductor unit being made of a group III-V semiconductor material;
    an electrode unit including a collector electrode, a base electrode and an emitter electrode that are respectively disposed on said collector layer, said base layer and said emitter layer; and
    a dielectric layer covering said emitter layer and a portion of an upper surface of said emitter electrode,
    wherein an opening extends through said dielectric layer and said emitter layer and terminates at said base layer to expose a contact region of said base layer, said base electrode being disposed on said contact region of said base layer, extending through said opening, and partially covering an upper surface of said dielectric layer.

2. The heterojunction bipolar transistor as claimed in claim 1, wherein said base electrode has a height (H) that is not less than 2000 Å.

3. The heterojunction bipolar transistor as claimed in claim 1, wherein said dielectric layer is made of a material selected from the group consisting of nitrides, oxides, oxynitrides, and combinations thereof.

4. The heterojunction bipolar transistor as claimed in claim 1, further comprising an isolation layer that covers said semiconductor unit, said electrode unit and said dielectric layer, and that has through holes to respectively expose said collector electrode, said base electrode and said emitter electrode.

* * * * *